United States Patent [19]

Haga

[11] Patent Number: 5,102,831

[45] Date of Patent: Apr. 7, 1992

[54] METHOD OF MANUFACTURING MULTI-CHIP PACKAGE

[75] Inventor: Akira Haga, Tokyo, Japan

[73] Assignee: NEC Corporation, Japan

[21] Appl. No.: 573,260

[22] Filed: Aug. 24, 1990

[30] Foreign Application Priority Data

Aug. 29, 1989 [JP] Japan .................................. 1-222266

[51] Int. Cl.$^5$ ..................... H01L 21/84; H01L 21/58; H01L 21/60
[52] U.S. Cl. .................................. 437/220; 437/206; 437/51; 437/205
[58] Field of Search .................. 437/205, 206, 220, 51; 29/829, 832; 357/70; 361/418, 420, 421

Primary Examiner—Olik Chaudhuri
Assistant Examiner—David E. Graybill
Attorney, Agent, or Firm—Laff, Whitesel, Conte & Saret

[57] ABSTRACT

A method of manufacturing a multi-chip package having at least two IC chips mounted on a substrate is disclosed. In this method, metal layers each having an area larger than that of each of the IC chips are formed on substrate portions on which the IC chips are mounted. The IC's are bonded to surfaces of the metal layers. A wiring pattern is bonded to a region on the substrate where the IC chips are not mounted. The IC chips are wire-bonded to the wiring pattern.

4 Claims, 7 Drawing Sheets

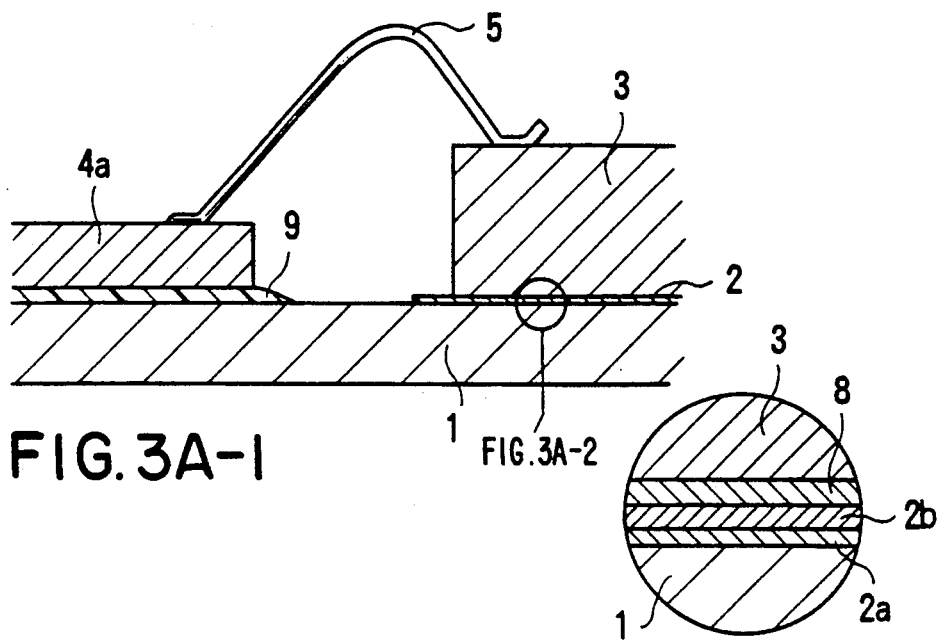
FIG.3A-1
FIG.3A-2
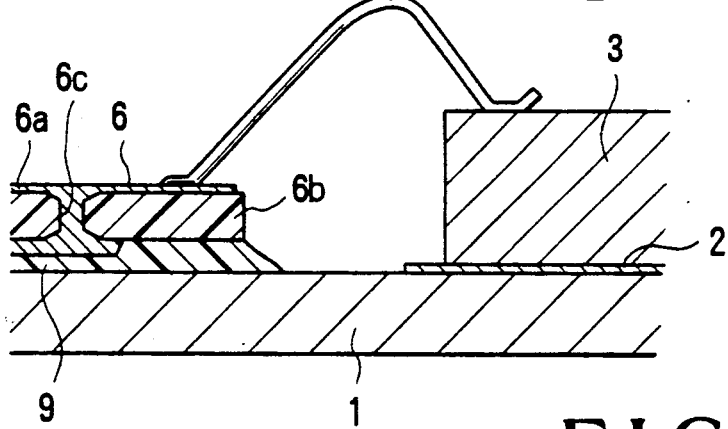
FIG.3B
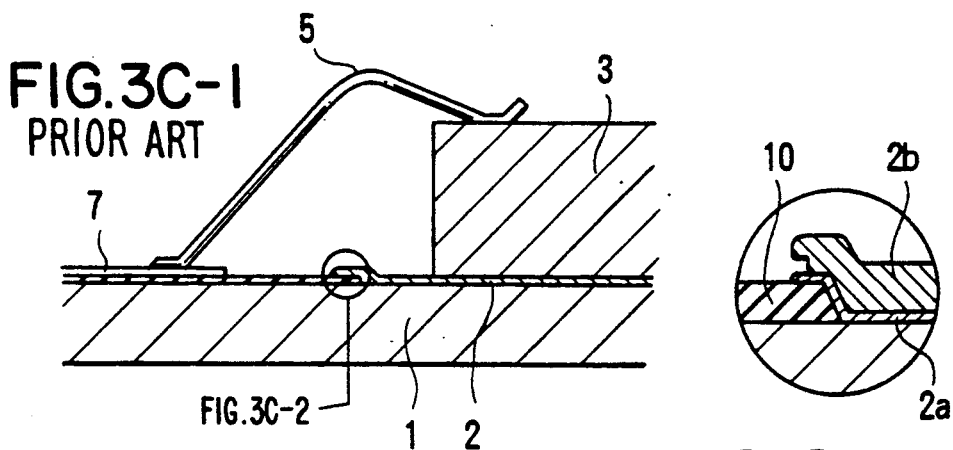
FIG.3C-1
PRIOR ART
FIG.3C-2
PRIOR ART

METHOD OF MANUFACTURING MULTI-CHIP PACKAGE

BACKGROUND OF THE INVENTION

The present invention relates to a method of manufacturing a multi-chip package having at least two IC chips mounted on a substrate.

A conventional multi-chip package of this type is designed such that a plurality of IC chips are mounted on a substrate having a wiring pattern formed thereon, and the wiring pattern and the IC chips are connected to each other by wire bonding. Ceramic substrates are often used. However, silicon substrates are sometimes used in consideration of heat dissipation and low stress to IC chips.

FIGS. 4A to 4C show a sequence of steps in a conventional method of manufacturing a multi-chip package.

As shown in FIG. 4A, die-attached metallized layers (metal layers constituting IC chip mounting portions) 2 and a wiring pattern 7 are formed at three positions on a silicon substrate 1. The die-attached metallized layers 2 are directly formed on the silicon substrate 1 so as to be electrically connected thereto. In addition, the wiring pattern 7 is formed in the entire region on the silicon substrate 1 except for portions corresponding to the die-attached metallized layers 2 through an $SiO_2$ or $Si_3N_4$ insulating film.

As shown in FIG. 4B, IC chips 3 are bonded (die-bonded) to the surfaces of the die-attached metallized layers 2. In this bonding step, an epoxy resin is widely used as a bonding material in consideration of a reduction in cost and stress to the IC chips. However, in consideration of a decrease in heat and resistance of the IC chips and electric conduction between the IC chips 3 and the silicon substrate 1, an Au-Si eutectic alloy is generally used for bonding.

Subsequently, as shown FIG. 4C, the respective IC chips 3 and the wiring pattern 7 are connected to each other by using bonding wires 5. Thereafter, the silicon substrate 1 is subjected to encapsulation and the like to manufacture a multi-chip package.

In the conventional method of manufacturing a multi-chip package, however, the wiring pattern 6 must be formed on the substrate in addition to the die-attached metallized layers 2 prior to die bonding of the IC chips 3. For this reason, the manufacturing period of a substrate is undesirably prolonged, and the cost is increased. In addition, when a modification of the wiring pattern is required, a new substrate must be formed again.

In addition, when die bonding of the IC chips 3 are to be performed by an Au-Si eutectic alloy method, since a heating temperature exceeds 400° C., an organic material and a resin material cannot be used as an insulating material.

Moreover, in the conventional method of manufacturing a multi-chip package, the level difference between the die-attached metallized layer 2 and the wiring pattern 7 is small, and the level difference between the IC chip 3 and the wiring pattern 7 is large. For this reason, it is difficult to ensure the ideal shape of the bonding wire 5. Such a drawback may be eliminated by polishing the lower surface of each IC chip 3 or denting the lower surface of each IC chip 3. In this case, however, the manufacturing yield of multi-chip packages is decreased.

SUMMARY OF THE INVENTION

It is an object of the present invention to provide a method of manufacturing a multi-chip package which allows a short manufacturing period, facilitates design and a modification of a wiring pattern, and allows connections of bonding wires in a stable form.

In order to achieve the above object, according to the present invention, there is provided a method of manufacturing a multi-chip package having at least two IC chips mounted on a substrate, comprising the steps of forming metal layers each having an area larger than that of each of the IC chips on substrate portions on which the IC chips are mounted, bonding the ICs to surfaces of the metal layers, bonding a wiring pattern to a region on the substrate where the IC chips are not arranged, and wire-bonding the IC chips to the wiring pattern.

According to the present invention, after only die-attached metallized layers are formed on substrate portions on which IC chips are mounted, the IC chips are die-bonded to surfaces of the die-attached metallized layers. Subsequently, a wiring pattern is bonded to a region on the substrate where no IC chips are mounted. With this procedure, since a substrate and a wiring pattern can be independently designed and manufactured, the manufacturing period of a substrate can be shortened, and the manufacturing cost can be reduced. In addition, design and a modification of a wiring pattern can be easily performed.

Furthermore, in the present invention, since a wiring pattern is formed upon die bonding of IC chips, an organic material or a resin material can be used as an insulation material for wiring and the like.

Moreover, since the present invention employs a method of bonding a wiring pattern such as a lead frame or a wiring pattern film, the wiring pattern can be formed at a position higher than die-attached metallized layers. For this reason, the level difference between the IC chips and the wiring pattern can be reduced. Therefore, when the IC chips and the wiring pattern are connected through bonding wires, each bonding wire can be formed to have an ideal shape.

BRIEF DESCRIPTION OF THE DRAWINGS

FIGS. 3A-1 to 3C-2 are views respectively showing sectional structures of portions near bonding wires of multi-chip packages according to the first and second embodiments and a prior art.

DETAILED DESCRIPTION OF THE PREFERRED EMBODIMENTS

Embodiments of the present invention will be described below with reference to the accompanying drawings.

FIGS. 1A to 1E show a sequence of steps in a method of manufacturing a multi-chip package according to the first embodiment of the present invention.

Figure 1A:
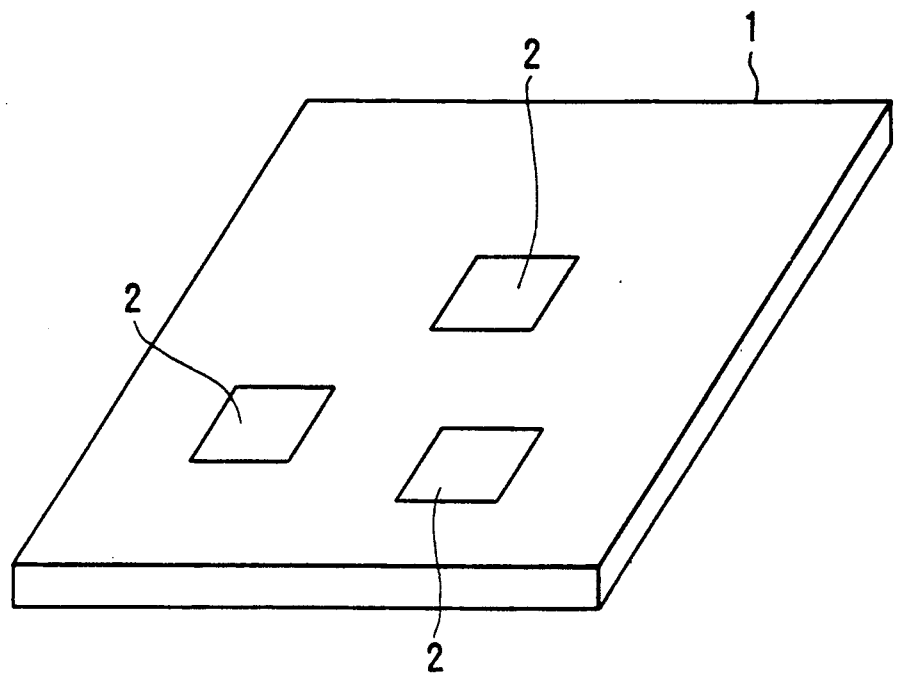
FIGS. 1A to 1E are perspective views showing a sequence of steps in a method of manufacturing a multi-chip package according to the first embodiment of the present invention.

As shown in FIG. 1A, after an $SiO_2$ or $Si_3N_4$ insulation film (not shown) is formed on a silicon substrate 1, three IC mounting portions on the silicon substrate 1 are selectively etched to remove the insulating film, and a Ti film and an Au film (none of them are shown) are sequentially stacked from the substrate side, thus forming die-attached metallized layers 2. With this operation, electric conduction between the die-attached metallized layers 2 and the silicon substrate 1 can be ensured.

Figure 1B:
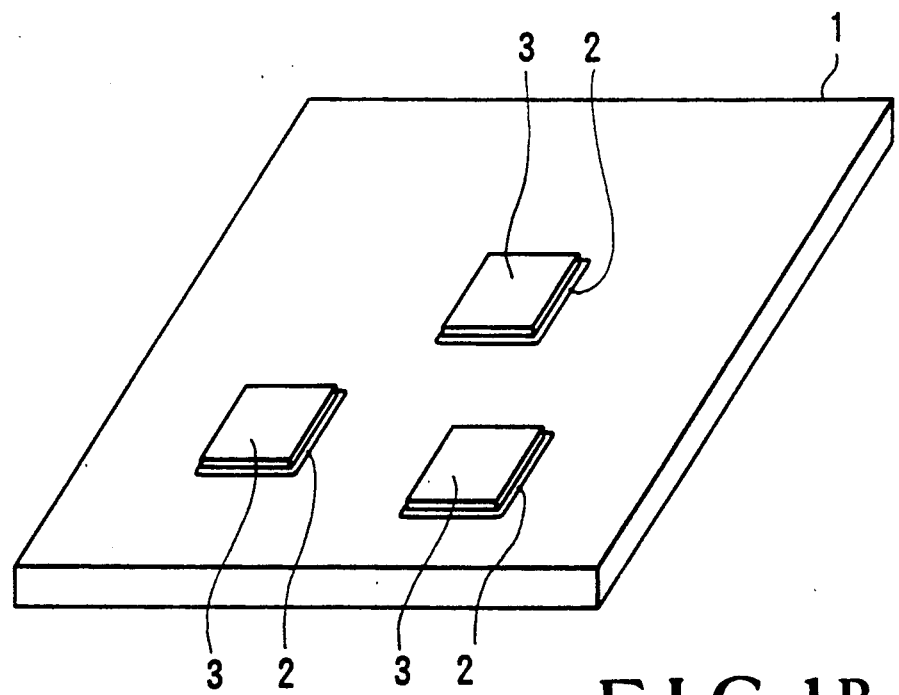

As shown in FIG. 1B, after the silicon substrate 1 is heated to 400° C. or more, IC chips 3 are bonded to the die-attached metallized layers 2 through an Au-Si alloy tape, thus performing die bonding of the IC chips 3.

Figure 1C:
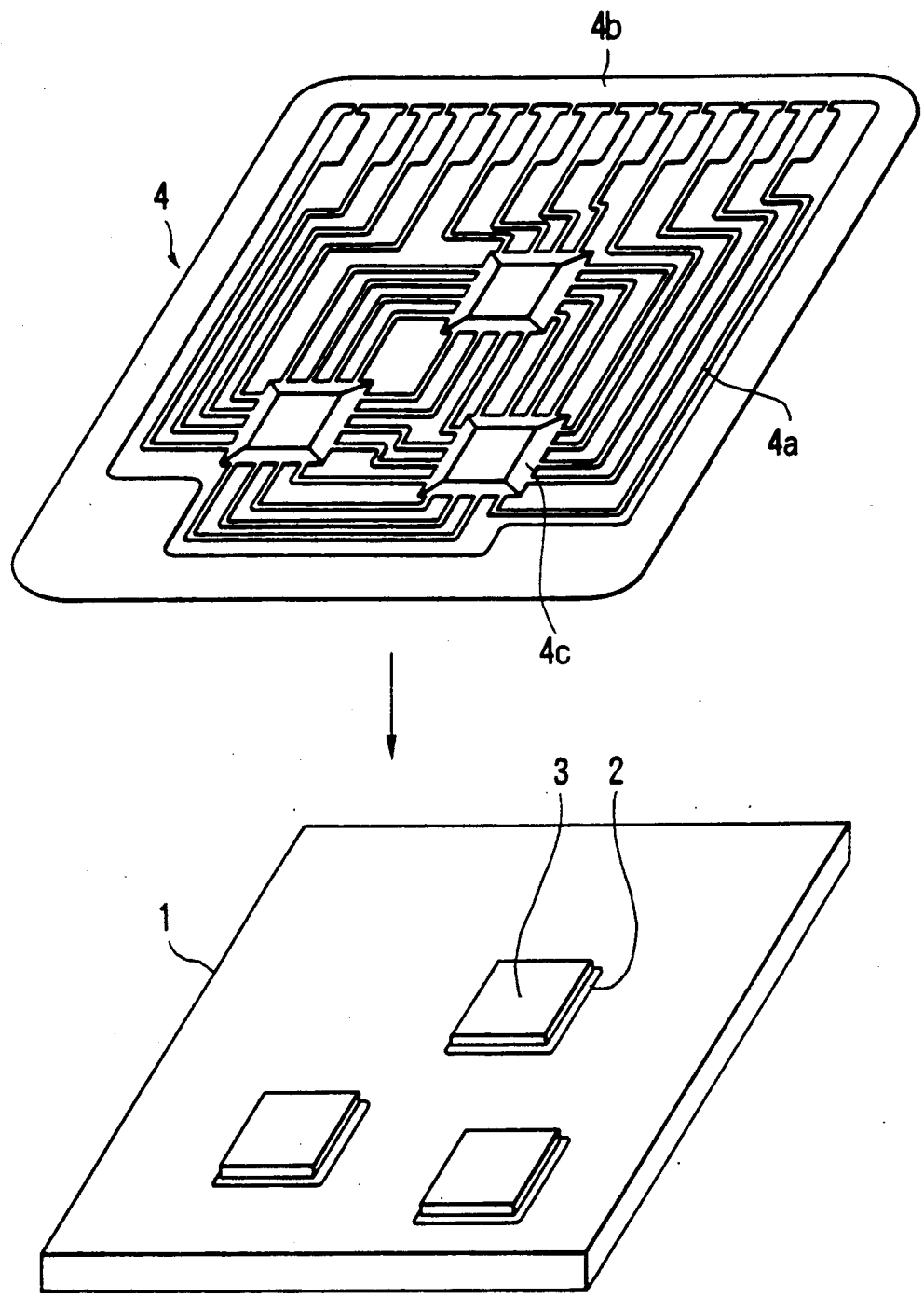

As shown in FIG. 1C, a lead frame 4 is prepared, on which regions to be fitted on the IC chips 3 on the silicon substrate 1 and a predetermined wiring pattern is formed. The lead frame 4 comprises internal leads 4a constituting the predetermined wiring pattern, an external tie-bar 4b, formed around the internal leads 4a, for protecting and supporting the internal leads 4a, and internal tie-bars 4c for fixing portions of the internal leads 4a which are connected to the IC chips 3.

Figure 1D:
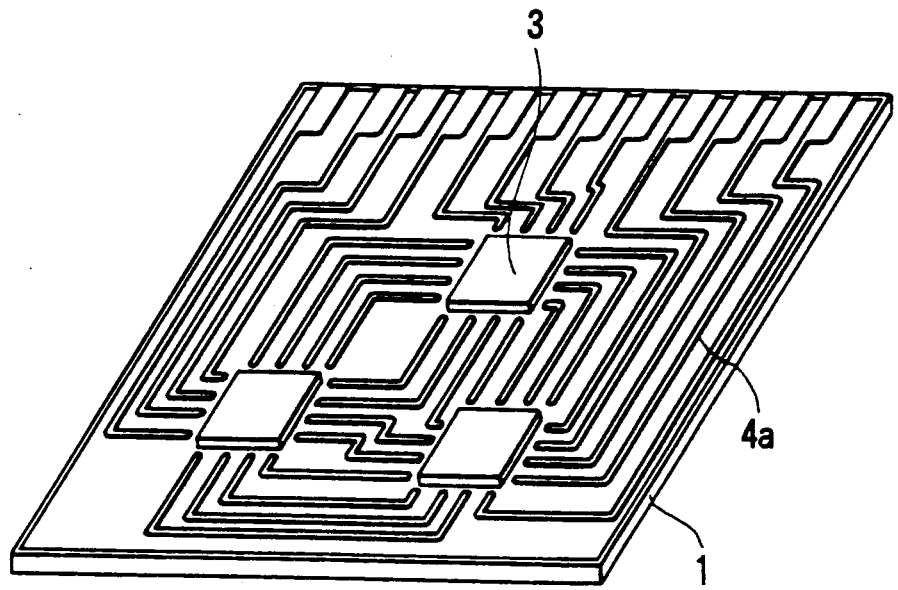

As shown in FIG. 1D, after the lead frame 4 is bonded to the silicon substrate 1 with an adhesive agent, the external tie-bar 4b and the internal tie-bars 4c are removed while the internal leads 4a are left.

Figure 1E:
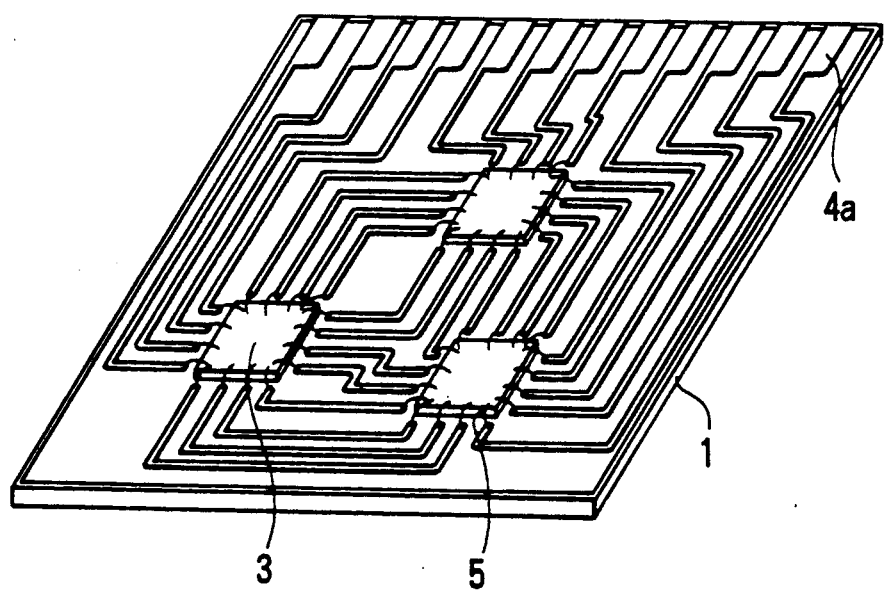

Subsequently, as shown in FIG. 1E, the IC chips 3 and the internal leads 4a are connected to each other through bonding wires 5. Thereafter, the silicon substrate 1 is subjected to predetermined processes such as encapsulation to manufacture a multi-chip package.

FIGS. 2A to 2D show a sequence of steps in a method of manufacturing a multi-chip package according to the second embodiment of the present invention. The second embodiment is different from the first embodiment in that a wiring pattern film is used in place of the lead frame in the first embodiment. The same reference numerals in FIGS. 2A to 2D denote the same parts as in FIGS. 1A to 1E, and a detailed description thereof will be omitted.

Figure 2C:
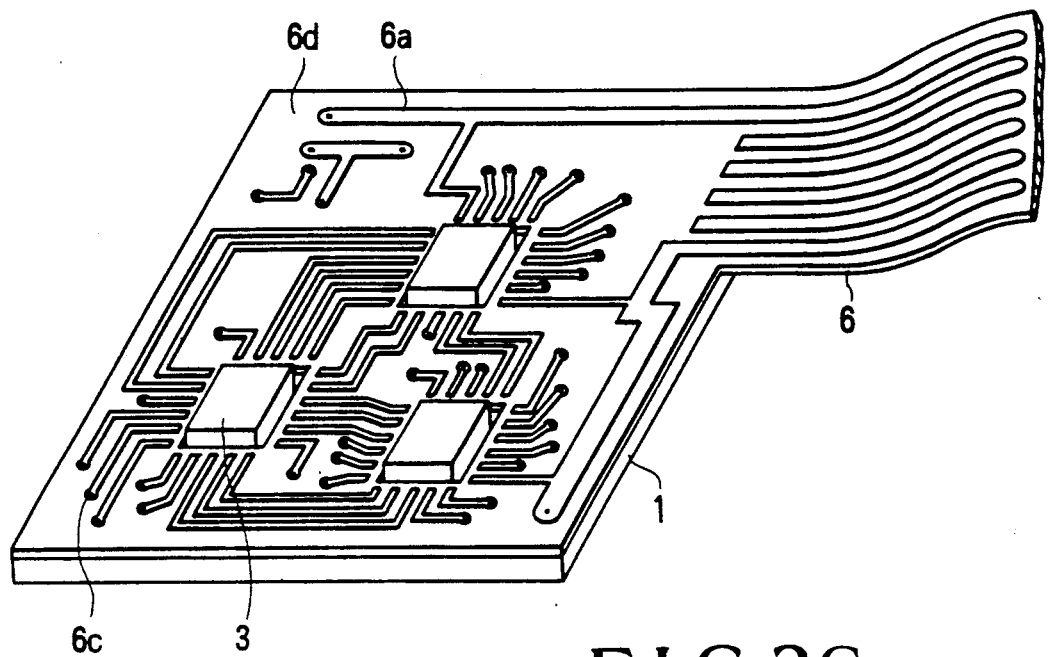
FIGS. 2A to 2D are perspective views showing a sequence of steps in a method of manufacturing a multi-chip package according to the second embodiment of the present invention.
Figure 2D:
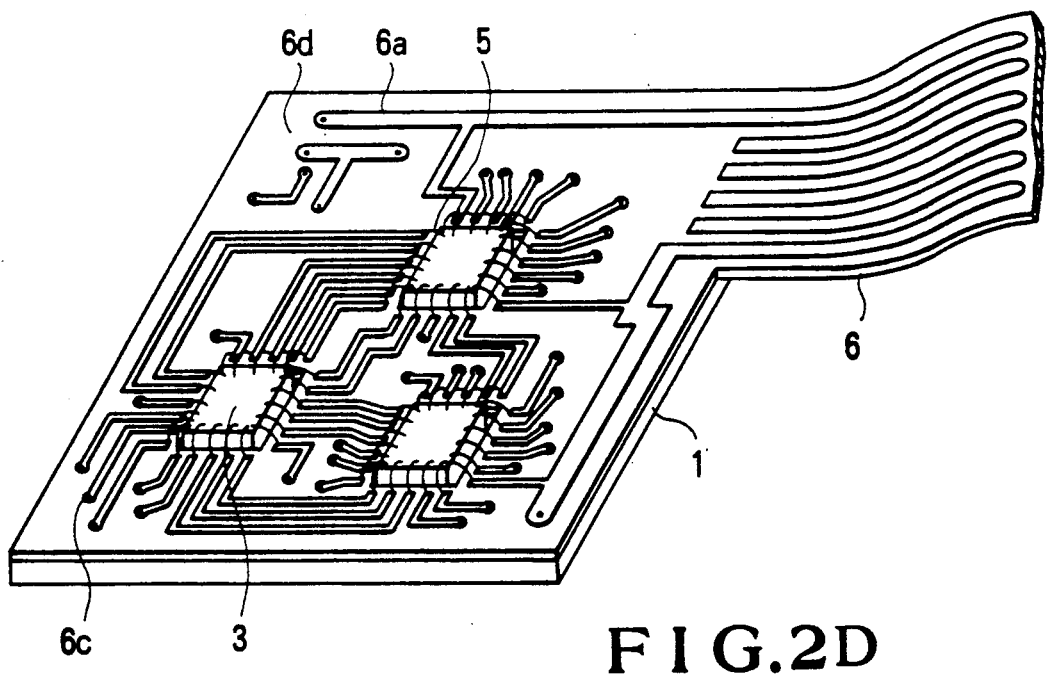
Figure 2A:
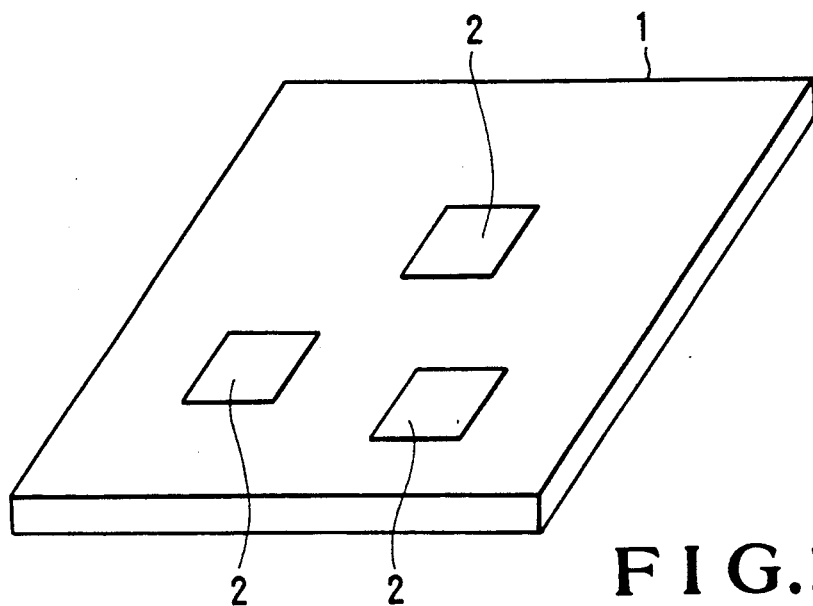

As shown in FIG. 2A, die-attached metallized layers 2 are formed on a silicon substrate 1.

Figure 2B:
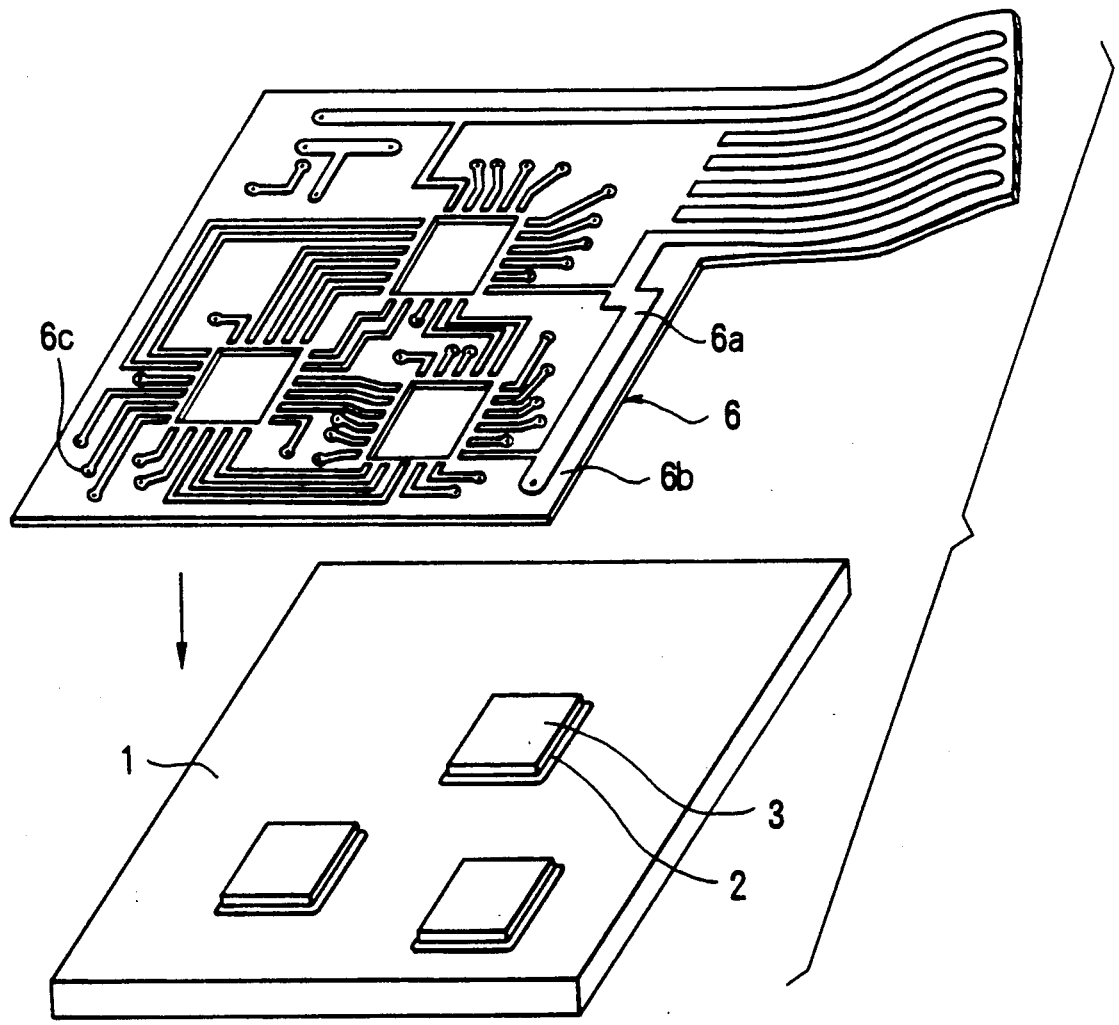
Figure 4A:
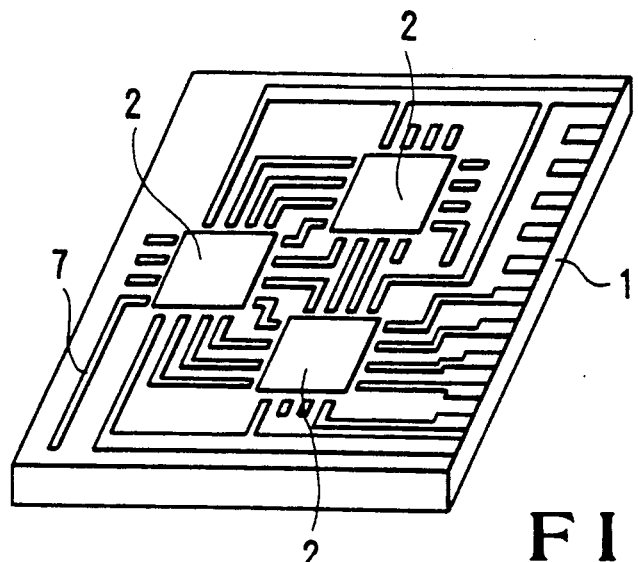
FIGS. 4A to 4C are perspective views showing a sequence of steps in a conventional method of manufacturing a multi-chip package.
Figure 4B:
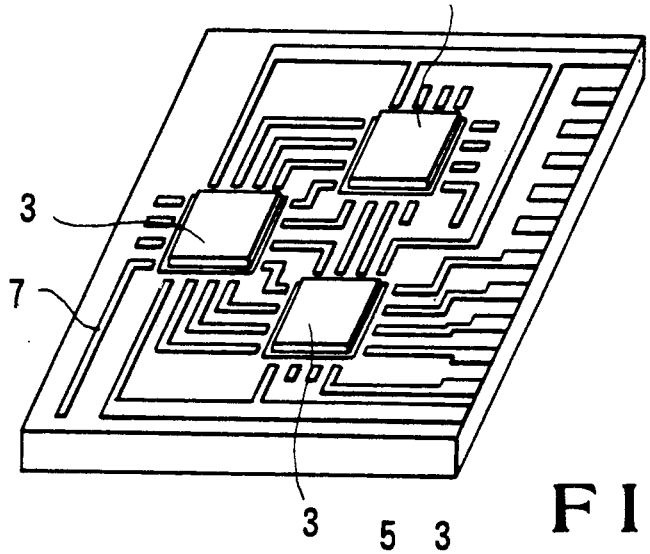
Figure 4C:
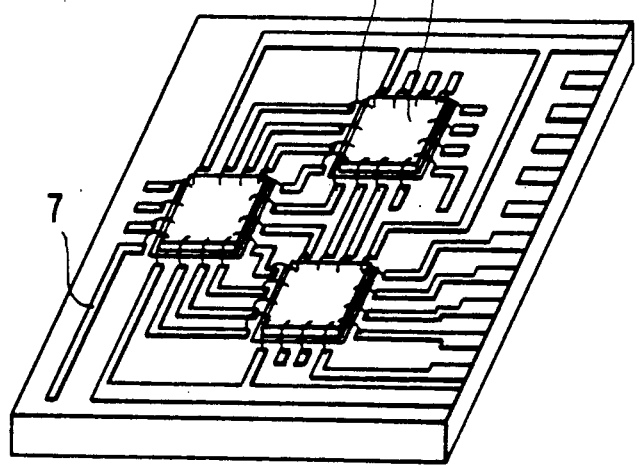

As shown in FIG. 2B, after IC chips 3 are bonded to the die-attached metallized layers 2 through an Au-Si alloy tape, a wiring pattern film 6 on which opening portions to be fitted on the IC chips 3 and a predetermined wiring pattern are formed is bonded to the silicon substrate 1 with an adhesive agent. The wiring pattern film 6 comprises a film base 6b consisting of an organic material such as polyimide, wiring patterns 6a which are respectively formed on the upper and lower surfaces of the film base 6b so as to realize a high pattern density, and through holes 6c for connecting the wiring pattern 6a formed on the upper and lower surfaces of the film base 6b.

After the wiring pattern film 6 is bonded to the silicon substrate 1 as shown in FIG. 2C, the IC chip 3 and the wiring pattern 6a are connected to each other through bonding wires 5. Thereafter, the silicon substrate 1 is subjected to predetermined processes such as encapsulation to manufacture a multi-chip package.

In this embodiment, since wiring of the IC chips can be formed by stacking a plurality of wiring pattern films 6 on the silicon substrate 1, the packing density of a multi-chip package can be further increased.

FIGS. 3A to 3C respectively show sectional structures of portions near bonding wires of the multi-chip packages according to the first and second embodiments and the prior art. The same reference numerals in FIGS. 3A to 3C denote the same parts as in FIGS. 1A to 1E, 2A to 2D, and 4A to 4C, and a detailed description thereof will be omitted.

As shown in FIG. 3A-1, in the multi-chip package according to the first embodiment, the internal lead 4a having a predetermined thickness is arranged on the silicon substrate 1 through an adhesive layer 9. For this reason, the level difference between the internal lead 4a and the IC chip 3 is reduced, and the bonding wire can be formed into an ideal shape. FIG. 3A-2 is an enlarged view of that portion of FIG. 3A-1 which is enclosed within circle 3A-2. The IC chip 3 is bonded to the die-attached metallized layer 2 consisting of a Ti film 2a and an Au film 2b through an Au-Si alloy layer 8. This bonding is performed before the internal lead 4a is bonded to the silicon substrate 1. For this reason, an organic material or a resin material can be used as an insulating material for the internal lead 4a.

Similarly, in the multi-chip package according to the second embodiment, as shown in FIG. 3B, since the level difference between the wiring pattern film 6 and the IC chip 3 is small, the bonding wire can be formed into an ideal shape.

In contrast to this, FIG. 3C-1 shows the conventional multi-chip package. FIG. 3C-2 shows an enlarged view of that part of FIG. 3C-1 which is enclosed in circle 3C-2. The level difference between the wiring pattern 7 formed on the silicon substrate 1 through the insulating film 10 and the die-attached metallized layer 2 is small. The level difference between the wiring pattern 7 and the IC chip 3 on the die-attached metallized layer 2 is large. For this reason, in the conventional manufacturing method, since the bonding wires 5 cannot be ideally formed, the connecting portions become unstable.

As has been described above, according to the present invention, after IC chips are die-bonded to a surface of the substrate, a wiring pattern is bonded to the surface of the substrate. With this procedure, since a substrate and a wiring pattern can be independently designed and manufactured, the manufacturing period of a multi-chip package can be shortened, and cost reduction can be realized. In addition, a substrate and a wiring pattern can be easily designed and modified. Especially, if die-attached metallized layers are formed on the entire surface of a substrate, a modification of design can be performed by simply modifying a wiring pattern.

In addition, according to the present invention, since a wiring pattern is formed upon die bonding of IC chips, an organic material or a resin material can be used as an insulating material for wiring.

Moreover, according to the present invention, since the level difference between each IC chip and a wiring pattern can be reduced, each bonding wire can be formed into an ideal shape.

What is claimed is:

1. A method of manufacturing a multi-chip package having at least two IC chips mounted on a substrate, comprising the sequential steps of:
    forming metal layers each having an area larger than that of each of the IC chips on substrate portions on which the IC chips are to be mounted;
    bonding the ICs to surfaces of said metal layers;

bonding a wiring pattern to a region on said substrate where the IC chips are not arranged; and wire-bonding the IC chips to said wiring pattern.

2. A method according to claim 1, wherein the step of bonding said wiring pattern comprises:

the steps of preparing a lead frame constituted by internal leads constituting a wiring pattern, an external tie-bar, arranged around said internal leads, for protecting and supporting said internal leads, and internal tie-bars for fixing portions of said internal leads which are connected to the IC chips; and removing said external and internal tie-bars after said lead frame is bonded to said substrate with an adhesive agent, and said wiring pattern being in a region on said substrate where the IC chips are not mounted.

3. A method according to claim 1, wherein the step of bonding said wiring pattern comprises the step of bonding a wiring pattern film having a wiring pattern formed thereon to said substrate.

4. A method according to claim 3, wherein said wiring pattern film comprises a film base made of an organic material, wiring patterns formed on the upper and lower surfaces of said film base, and through holes for connecting said wiring patterns formed on the upper and lower surfaces of said film base.

* * * * *